(12) United States Patent
Schell et al.

(10) Patent No.: US 10,177,897 B2
(45) Date of Patent: Jan. 8, 2019

(54) METHOD AND SYSTEM FOR SYNCHRONIZING AND INTERLEAVING SEPARATE SAMPLER GROUPS

(71) Applicant: ANALOG DEVICES, INC., Norwood, MA (US)

(72) Inventors: Robert Schell, Chatham, MA (US); Robert D. Bishop, Chelmsford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/287,812

(22) Filed: Oct. 7, 2016

(65) Prior Publication Data
US 2018/0102895 A1 Apr. 12, 2018

(51) Int. Cl.
*H04L 7/00* (2006.01)
*H04L 1/00* (2006.01)
*H04L 7/033* (2006.01)

(52) U.S. Cl.
CPC .......... *H04L 7/0012* (2013.01); *H04L 1/0071* (2013.01); *H04L 7/0331* (2013.01); *H04L 7/0008* (2013.01); *H04L 7/0338* (2013.01)

(58) Field of Classification Search
CPC ....... G06F 1/12; H04L 7/0338; H04L 1/0071; H04L 7/0008; H04L 7/0012; H04J 3/0685
USPC ............................. 375/356; 327/144, 141, 91
See application file for complete search history.

(56) References Cited

U.S. PATENT DOCUMENTS

| | | | |
|---|---|---|---|
| 7,092,471 B2 | 8/2006 | Lentine et al. | |
| 7,602,869 B2 | 10/2009 | Emami-Neyestanak et al. | |
| 8,331,512 B2 | 12/2012 | Lee et al. | |
| 8,767,898 B2 | 7/2014 | Verhaegen et al. | |
| 8,917,124 B1* | 12/2014 | Waltari | H03L 7/091 327/147 |
| 2004/0158420 A1 | 8/2004 | Kim et al. | |
| 2006/0140321 A1 | 6/2006 | Tell et al. | |
| 2010/0220828 A1 | 9/2010 | Fuller et al. | |

(Continued)

OTHER PUBLICATIONS

International Search Report and Written Opinion issued in International Patent Application Serial No. PCT/US2017/055277 dated Jan. 22, 2018, 9 pages.

*Primary Examiner* — Leila Malek
(74) *Attorney, Agent, or Firm* — Patent Capital Group (57) ABSTRACT

Serial data transfer uses ever increasing transmission rates. The data transfer rate of a clock-and-data recovery (CDR) deserializer can be increased by using multiple independent sampler blocks that process serial input data in parallel. For this purpose, the clock output signals from the various independent blocks are first mutually aligned in proper order using a lower speed clock, and subsequently offset from one another such that sampling instances of the various sampler blocks are interleaved. Digitized data words corresponding to common input data and outputted by the various sampler blocks are compared after alignment of the clock output signals to correct additional timing misalignment between the multiple sampler blocks. The digitized data words need only be aligned once or at most infrequently after the clock output signals are aligned, since the additional timing misalignment is caused mainly path delays that are substantially invariant over time.

20 Claims, 6 Drawing Sheets

(56) References Cited

U.S. PATENT DOCUMENTS

2013/0003907 A1    1/2013   Wenske
2015/0303909 A1   10/2015   Arcudia et al.

\* cited by examiner

METHOD AND SYSTEM FOR SYNCHRONIZING AND INTERLEAVING SEPARATE SAMPLER GROUPS

FIELD OF THE DISCLOSURE

This invention describes a method to increase data transfer rate of high-speed clock-and-data recovery deserializer (CDR/deserializer) in serial link receivers by using multiple independent blocks of samplers. Multiple groups of sampling clocks are aligned in proper order to generate samples at multiples of the sampling clock frequency of each sampler.

BACKGROUND

High-speed data received at a data rate FDATA are sampled in serial link receivers by a set of samplers and these samples are then generally sent to a digital section that interprets these samples as being a 'data' sample (D) and then an 'edge' sample (E). For example, if the data rate FDATA matches the sampling clock frequency FSCLK, two samples per data unit interval (UI) can be acquired by taking one sample at the rising edge of FSCLK and another sample at the falling edge of FSCLK (or, alternatively, on the rising edge of $\overline{FSCLK}$). These D and E samples can be used by a delay-locked loop (DLL) to select the appropriate sampling phase and to track jitter that randomly shifts the input data. The setup with FSCLK=FDATA is referred to as "full-rate" mode, since the sampling clock (using the edges of both FSCLK and $\overline{FSCLK}$) is matched 'in full' to the data rate.

As the input data rate increases, "full rate" mode operation becomes more difficult due to the difficulty in designing a sampler block that can operate at these higher frequencies. This situation may be alleviated, for example, by doubling the number of samplers and having each sampler work at half the data rate FDATA. This is referred to as "half-rate" mode. If the data rate FDATA is still too high for the samplers and the speed of a given sampler cannot feasibly be increased further, then the number of samplers may again be doubled, so that each sampler would run at an even lower sampling clock frequency FSCLK, e.g. in "quarter-rate" mode. However, it then becomes more and more difficult to ensure that the sampling paths, starting from some single high-speed distribution point, can generate, buffer and distribute these sampling clocks while maintaining the initial phase relationships.

It would therefore be desirable to provide a method to efficiently align the sampling clocks of multiple independent samplers in order to extend the effective data rate that can be processed by each sampler, without changing the sampling rate at which each sampler can reliably operate.

SUMMARY OF THE DISCLOSURE

Serial data transfer uses ever increasing transmission rates. The data transfer rate of a clock-and-data recovery (CDR) deserializer can be increased by using multiple independent sampler blocks that process serial input data in parallel. For this purpose, the clock output signals from the various independent blocks are first mutually aligned in proper order using a lower speed clock, and subsequently offset from one another such that sampling instances of the various sampler blocks are interleaved. Digitized data words corresponding to common input data and outputted by the various sampler blocks are compared after alignment of the clock output signals to correct additional timing misalignment between the data words from the multiple sampler blocks. The digitized data words need only be aligned once or at most infrequently after the clock output signals are aligned, since the additional timing misalignment is caused mainly by path delays that are substantially invariant over time.

In certain embodiments, a method is provided for aligning sampling instances of high-data-rate clock-and-data recovery deserializer (CDR/deserializer) having multiple sampler blocks, with the steps of delaying a second sampling clock phase of a second sampler block in relation to a first sampling clock phase of a first sampler block; measuring first and second clock output signals produced by the first and second sampler blocks and examining relative positions of the first and second clock output signals by varying a delay between the first and second sampling clock phase; determining from the relative positions, as a function of the delay, a point of alignment where the first and second clock output signals are aligned; and based on the determined point of alignment, offsetting the measured first and second clock output signals from one another such that the sampling instances of the first and second sampler blocks are temporally interleaved. The respective clock output signals may be decimated clock output signals.

In certain embodiments, a system for aligning sampling instances of a high-data-rate clock-and-data recovery deserializer (CDR/deserializer), with first and second substantially identical sampler blocks operating in parallel and receiving common serial input data, wherein each sampler block has a phase interpolator receiving a reference clock signal and generating a respective sampling clock phase, and a delay-locked loop (DLL) block producing a synchronous clock output signal and a parallel data word corresponding to received serial input data. The phase interpolator of the second sampler block varies a delay of the second sampling clock phase in relation to the first sampling clock phase in order to determine, as a function of the delay, a point of alignment where the respective synchronous clock output signals are aligned relative to one another.

BRIEF DESCRIPTION OF THE DRAWINGS

Other features and advantages of the present invention will be more readily apparent upon reading the following description of currently preferred exemplified embodiments of the invention with reference to the accompanying drawing, in which.

DETAILED DESCRIPTION

Sampling circuits in a clock-and-data recovery deserializer (CDR/deserializer) sample incoming serial data at a sampling frequency or sampling rate commensurate with a clock frequency from, for example, a reference clock that may determine the data rate. With increasing sampling rates, clock distribution across chips or circuits consumes an increasing amount of power, and different path lengths may cause time delays that become difficult to manage. This then can limit the upper frequency range at which samplers can reliably operate.

Sampling rates may conceivably be increased beyond the safe operating range of a single sampler by operating several samplers in parallel at a reduced clock rate, which could correspond to a fraction, e.g. one half, one quarter, etc., of the data rate. While not required, in some embodiments, the sampling rate for each of the several samplers may be operated at the same reduced clock rate. For example, each sampler may then 'spend' twice or four times as long to process the incoming data relative to a time period associated with an environment in which each sampler is configured to operate at the original clock rate. When the reduced clock rate is used by the several samplers, to recover the digitized high-speed data, the sampled data needs to be recombined in the proper order, meaning that the clocks and ultimately the data words of the samplers should be properly aligned. A system and method for efficiently processing serial data at high clock rates by using samplers operating at reduced sampling rates will now be described.

Figure 1:
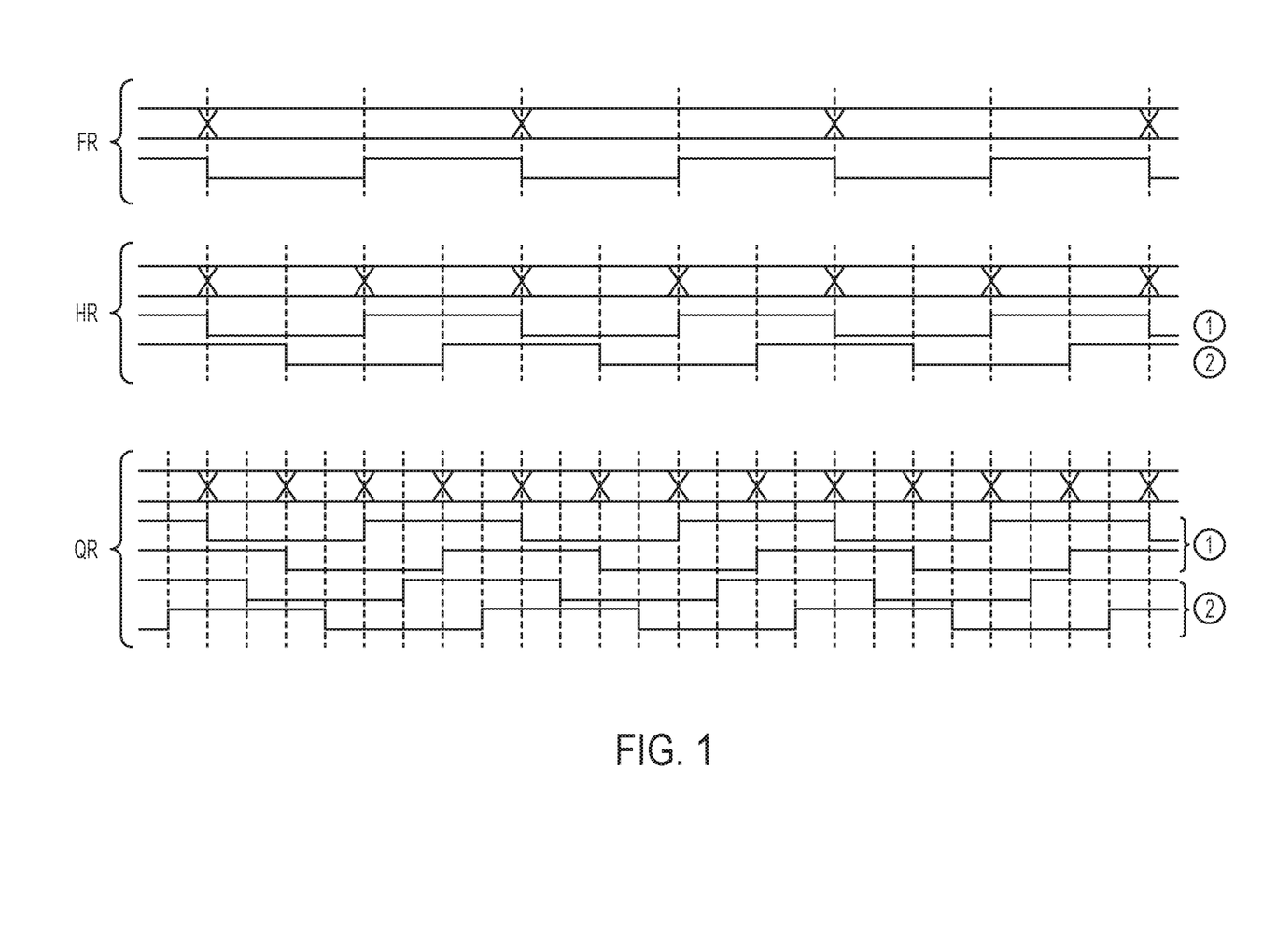
FIG. 1 shows a timing diagram of a data clock and sampling clocks duplicated into different instantiations for use in Full-rate (FR), Half-rate (HR) and Quarter-rate (QR) systems, according to some embodiments of the disclosure.

FIG. 1 shows schematically in each of the three diagrams labeled FR (full-rate mode), HR (half-rate mode) and QR (quarter-rate mode) in the upper trace an eye diagram of a data clock rate FDATA corresponding to the clock rate at which incoming serial data should be processed. Samples are taken at every edge of every sampling clock FSCLK and $\overline{FSCLK}$ shown in the lower trace in each of the three diagrams. For illustration purposes only, in FIG. 1, the data clock rate is shown as being doubled while the sampling clock frequency FSCLK remains the same.

In an exemplary embodiment, incoming data at 10 Gb/s may be sampled by two samplers, each having a full rate limit of 5 Gb/s. At this point, the FSCLK is now half the frequency/baud rate of FDATA, and is referred to as half rate mode (HR) —see the middle diagram in FIG. 1. The markers ① and ② in FIG. 1 denote that that respective sampling clock originates from a half-circuit that was duplicated. In FR there is one sampling clock; in HR, each half-circuit has its own sampling clock, wherein the different sampling clocks must be aligned so as to now be able to create aggregate samples from the two half circuits at the incoming data rate, i.e. at twice the sampling clock rate of the half circuits.

Although the half-rate, quarter-rate, etc. sampling clock rates may be generated by decimating a clock rate of a master clock operating at the data rate frequency, this becomes more and more difficult with increasing data rate FDATA and the number of samplers. For example, the clock rate of a higher-speed clock can be decimated using a combination of latches, such as two latches connected as a flip-flop for a division by two, or three latches for a division by three, and so on.

For instance, if a data clock source at 5 GHz (clock period=200 ps) is distributed to two different locations 1 and 2 that have clocking sampling circuits that are sampling the same input signal (such as in CDRs), the signal paths (propagation times or time delays) to location 1 may be different from the signal paths to location 2. The rising edges at location 1 and location 2 then occur at different times in relation to the input signal they are sampling. In some embodiments, data that are equally spaced in time may advantageously be sampled alternately, i.e. a first sample may be taken from location 1, then a second sample from location 2, then third sample from location 1 and a fourth sample location 2, and so on. In this way, the sampling instances (i.e., the rising edges) can be spaced by 100 ps. For example, a rising edge is obtained at location 1 at time 0, then 100 ps later a rising edge is obtained at location 2, then 100 ps later a falling edge is obtained at location 1 (a falling edge of a clock pulse CLK corresponds to the rising edge of $\overline{CLK}$ for that sampler), then 100 ps later a falling edge of CLK (rising edge of $\overline{CLK}$) is obtained at location 2, and so on. This approach allows sampling at 10 GHz using a 5 GHz clock, provided that the rising edges at location 1 and location 2 are precisely 100 ps apart.

In some embodiments, an additional division by two may be added at each location, so the clock at location 1 may then operate at 2.5 GHz and the clock at location 2 may likewise operate at 2.5 GHz, without affecting the incoming data rate. All these clocks should likewise be aligned so as to be able to alternate between location 1 and location 2.

In other words, the clock rates may be divided down or decimated to run at lower-frequencies (for example, hundreds of MHz instead of GHz) and operate with an algorithm that will result in proper alignment/interleaving of rising edges at locations 1 and 2. If further decimation is desired, additional dividers (not shown) may be added.

Figure 2:
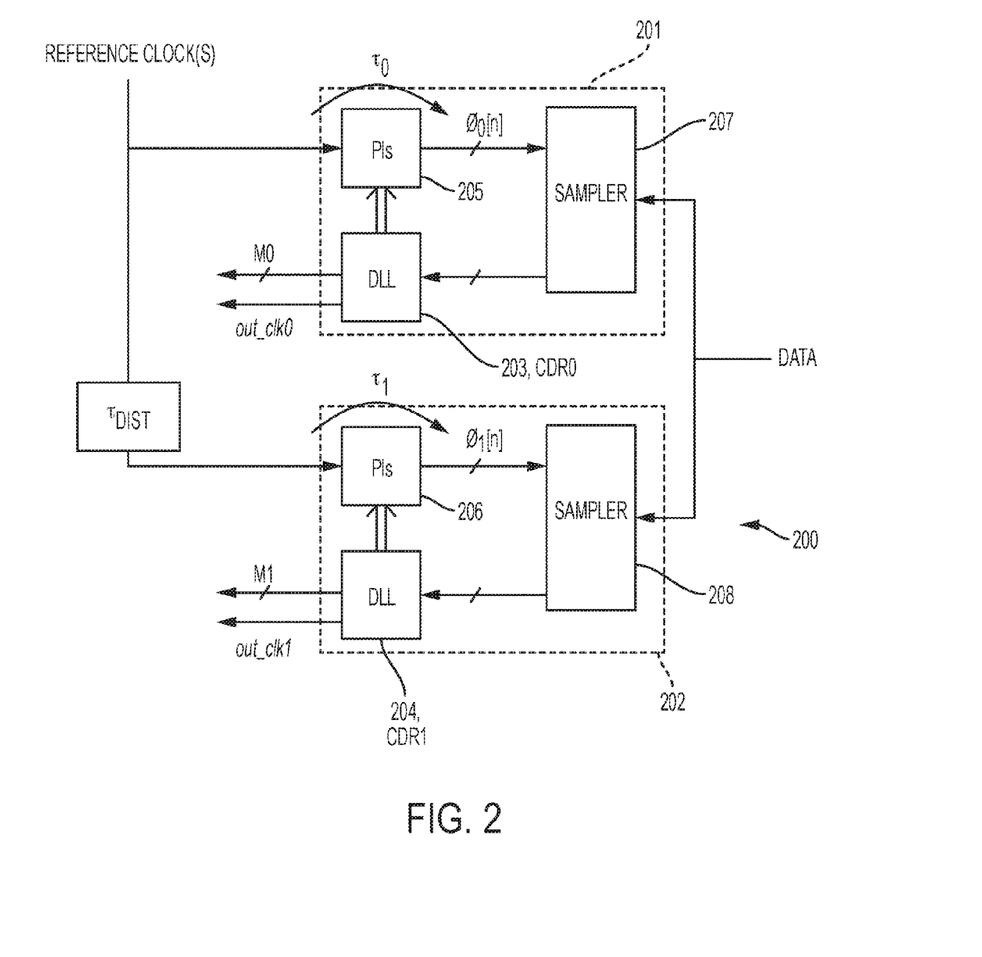
FIG. 2 shows a schematic block diagram for doubling the sampling rate of incoming serial data by using two sampler blocks with phase interpolation to interleave sampling clocks $\phi_0[n]$ and $\phi_1[n]$, according to some embodiments of the disclosure.

According to some embodiments of the disclosure, FIG. 2 shows a schematic circuit diagram of a high-speed sampling circuit 200 having two substantially identical sampler blocks 201, 202 with phase-interpolation capabilities to interleave the sampling clocks $\phi_0[n]$ and $\phi_1[n]$ for the purpose of doubling the sampling rate of incoming DATA. Each dashed block 201, 202 may contain a respective sampling clocks and data recovery unit DLL 203, 204, or CDR, CDR2, respectively, complete with respective phase finite-precision shifters or interpolators (PI) 205, 206, and respective samplers 207, 208 clocked by the sampling clocks $\phi_i[n]$ derived from reference clocks, which may supply reference clock pulses to the respective sampler blocks 201, 202. The clocks pulses from the sampling clocks $\phi_i[n]$ are temporally delayed by the respective phase-shifter or phase interpolator 205, 206 that basically delays the reference clock some digitally programmable amount using a, for example, digital code word providing 5-bits or 6-bits of resolution. Due to path delays and the layout of the sampler blocks 201, 202 on a chip, the reference clock pulses arriving at the sampler blocks 201, 202 may be delayed with respect to one another (shown as $\tau_{DIST}$ in FIG. 2).

It will be assumed that the digitized output bits from samplers 207, 208 are available for examination. Additionally, it will be assumed that, as in deserialization applications, the sampling instant for some of the samplers can be moved (in the same manner that the D and E bits are used by a DLL to align the sampling phase to the incoming data eye via a phase interpolator). The digitized output bits from samplers 207, 208 travel to the DLL blocks 203, 204 that produce corresponding lower-speed parallel data words M0, M1 as well as synchronous output signals out_clk0 and out_clk1 in each of the sampler blocks 201, 202. For example, as already briefly described above, the sampling rate may then be doubled by interleaving the sampling clocks $\phi_0[n]$ and $\phi_1[n]$ from sampler blocks 201, 202. It will be understood that the circuit 200 may have more than two sampler blocks.

In general, the path delay $\tau_{DIST}$ in the reference clock distribution is not known, but can be assumed to be constant over time since it depends substantially only on the circuit layout on the chip. Additionally, although the circuits are matched as closely as possible, there may be some fabrication mismatch in the phase interpolator path delays of sampler blocks 201, 202 (shown as $\tau_0$ and $\tau_1$). The object is now to first align the phases of output signals out_clk0 and out_clk1 in each of the sampler blocks 201, 202 with respect to one another, which can be done in spite of the fact that $\tau_{DIST}$, $\tau_0$ and $\tau_1$ are unknown and that $\tau_0$ and $\tau_1$ may be different from one another.

According to some embodiments of the disclosure; the output signals out_clk0 and out_clk1 may be examined and mutually aligned by using the output signal out_clk0 from, for example, the sampler blocks 201 to sample the other output signal out_clk1 of the sampler blocks 202 by, for example, keeping the sampling clock $\phi_0[n]$ of sampler 207 constant, while sweeping the sampling clock $\phi_1[n]$ (via the phase interpolator 206) of the other sampler 208. Once the output signals out_clk0 and out_clk1 are mutually aligned, they can then be offset by a fixed number of phases (given the resolution of the phase interpolators 205, 206) to uniformly space the sampling instances in time, thus generating in the illustrated embodiment with two samplers 207, 208 operating at twice the effective sampling rate.

Since the output signals out_clk0 and out_clk1 are a (decimated) division of the reference or sampling clock, it follows that the sampling clocks and the data packing will be aligned if the two output signals out_clk0 and out_clk1 are aligned. Since out_clk0 and out_clk1 already exist in the respective sampler blocks 201, 202 and operate at a slower frequency, for example up to 650 MHz, than the reference or sampling clock, the output signals out_clk0 and out_clk1 can be examined to determine the clock ordering without disturbing the sampling clock that may operate above 3 GHz.

Figure 3:
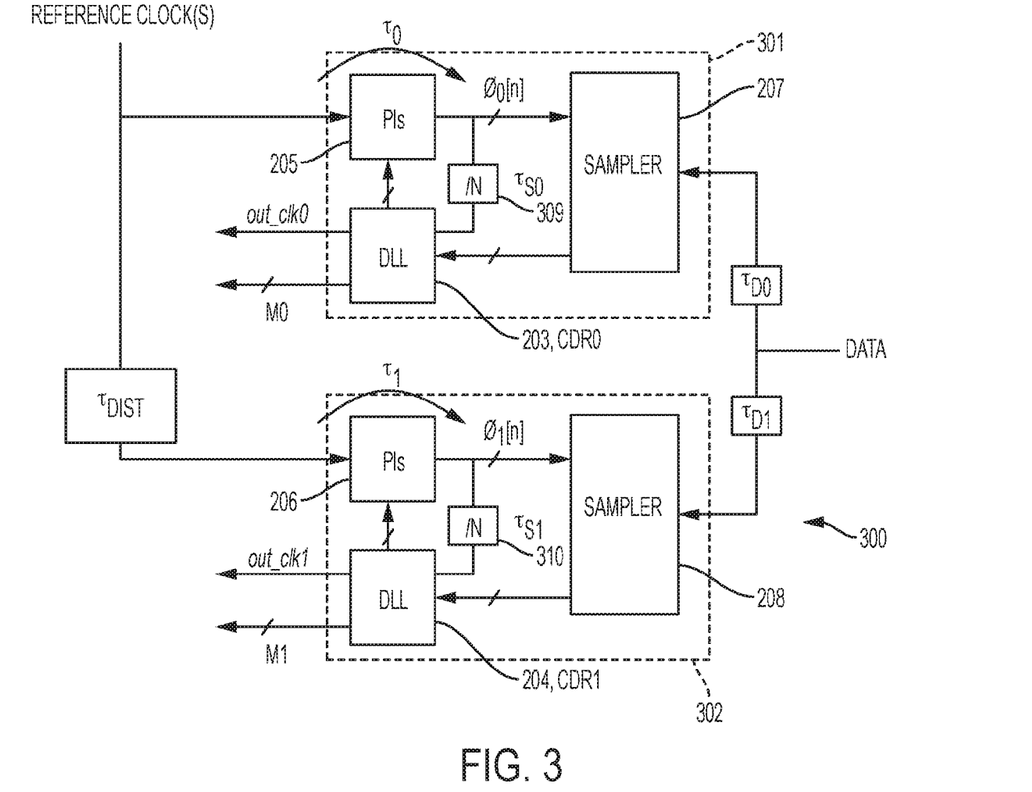
FIG. 3 shows the block diagram of FIG. 2 with additional timing skew introduced by clock frequency dividers and differences in path delays, according to some embodiments of the disclosure.

According to some embodiments of the disclosure illustrated in FIG. 3, each of the output signals out_clk0 and out_clk1 may be decimated by N (while ensuring that the dividers 309, 310 are in synch) so that the alignment can be done at a lower clock rate, meaning at a lower speed, while still being synchronous. However, as indicated in FIG. 3, the division by N may introduce additional path delays labeled $\tau_{S0}$ and $\tau_{S1}$. All these aforementioned path delays should be taken into account for clock synchronization in a first step in the overall synchronization scheme.

Due to buffering and/or division, there may be a time offset in the path from the sampling instant in samplers 307, 308 to the point at which the output signals out_clk0 and out_clk1 sample each other. Examine the path from the sampling clock with sampling clock $\phi_0[n]$ in sampler blocks 301 to out_clk0 (the output signal out_clk0 is in this example used for examination and assumed to be phase-invariant) and the similar path from the sampling clock $\phi_1[n]$ in sampler blocks 302 to output signal out_clk1. The respective path delays $\tau_{DIST}$, $\tau_0$, $\tau_1$ $\tau_{S0}$ and $\tau_{S1}$ (the latter path delays are generated in the dividers 309, 310) need not be determined individually, but must together be taken into account when aligning the clocks out_clk0 and out_clk1. In the event that the two paths (which include a division by N to reduce the frequency to that of the parallel word that accompanies the data) in sampler blocks 301, 302 have identical path and gate delays, then measuring the output signals out_clk0 and out_clk1 clocks against each other is equivalent to measuring them at the actual sampling instance. These path delays are diagrammed as $\tau_{S0}$ and $\tau_{S1}$ in FIG. 3, and if these are unequal then there is some "timing skew" $\tau_{skew}$ between the inputs to samplers 207, 208. The timing skew $\tau_{skew}$, which may occur due to mismatches in chip fabrication, will directly cause a 1:1 time measurement error of the interleaved words M0 and M1 even when the two output signals out_clk0 and out_clk1 are perfectly aligned.

If the path delays $\tau_{D0}$ and $\tau_{D1}$ in getting DATA to those sampler blocks shown in FIG. 3 are different, then this time difference $|\tau_{D0}-\tau_{D1}|$ can be rolled into the path delays of the dividers such that the parameter $\tau_{skew}$ in this case becomes $\tau_{skew}=(\tau_{S0}+\tau_{D0})-(\tau_{S1}+\tau_{D1})$. Thus even when $\tau_{S0}=\tau_{S1}$ and the sampling clocks are perfectly aligned, the alignment of the output signals out_clk0 and out_clk1 alone will then not guarantee that the actual data samples are also synchronized. $\tau_{skew}$ is expected to be a random, but stable value which may be dependent upon process, temperature, and voltage and may vary from chip to chip.

Alignment of the Phases of Sampling Clock $\phi0[n]$ and $\phi1[n]$

According to some embodiments of the disclosure, the sampling clocks $\phi0[n]$ and $\phi1[n]$ may be aligned by comparing the output signals out_clk0 and out_clk1 which are a synchronous subdivision of the sampling clock rate, and aligning them to the edge that produces the deserialized words to make bit-interleaving straightforward. In this context, a rising edge of out_clk (this will apply with modifications also to the falling edge) is synchronous with the deserialized data word. Additional calibration may be necessary to absorb a timing skew $\tau_{skew}$ in the paths within sampler blocks 301, 302 that relate the respective sampling clock $\phi0[n]$ to out_clk0 and similarly the respective sampling clock $\phi1[n]$ to out_clk1.

Figure 4:
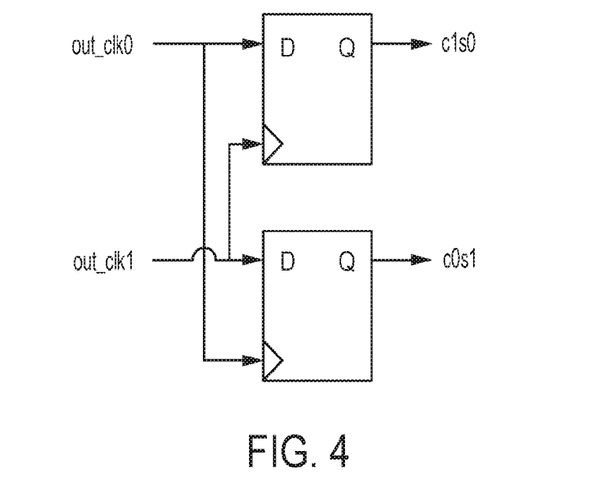
FIG. 4 shows a schematic circuit diagram that allows two sampling clocks to sample each other.

To determine a point of alignment where the output signals out_clk0 and out_clk1 are aligned, the two output signals sample each other. A circuit that allows the two output signals out_clk0 and out_clk1 to sample each other is illustrated schematically in FIG. 4. The result of sampling out_clk1 with out_clk0 will hereinafter be denoted as 'c0s1', and the result of sampling out_clk0 with out_clk1 will hereinafter be denoted as 'c1s0'. By using the phase interpolator 206 in sampler block 302 to move the sampling edges of sampler block 302 around (and hence the edges of output signal out_clk1) while keeping the phase of sampler block 301 fixed, the two output signals move with respect to each other. It can thus be determined what the phase of sampler block 302 must have been when the two output signals out_clk0 and out_clk1 were aligned in time by finding in an orderly fashion the phase codes of sampler block 302 that cause c0s1 and c1s0 to change state. If the timing skew $\tau_{skew}=0$, then this would also indicate the sampling phases are aligned in time.

Figure 5:
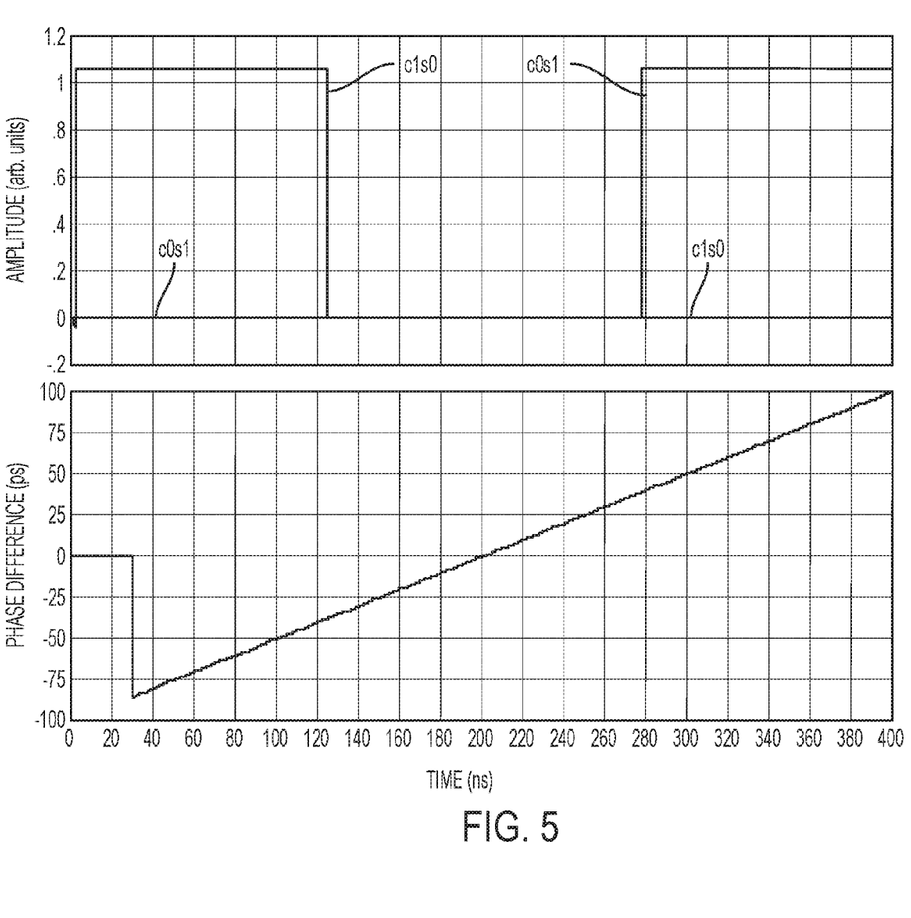
FIG. 5 shows a simulation of two sampling clocks according to FIG. 4 sampling each other as a function of increasing delay of one clock, according to some embodiments of the disclosure.

According to some embodiments of the disclosure, FIG. 5 shows a simulation of the behavior of c0s1 and c1s0, wherein the phase of out_clk1 was swept while the phase of out_clk0 was fixed at a clock frequency of 700 MHz. The x-axis is time, and in this simulation as time progresses the phase codes to PI 206 are increased, thus the phase relationship between out_clk0 and out_clk1 is varied. As illustrated in the top part of FIG. 5, c1s0 transitions at a falling edge at around 122 ns from HIGH (H) to LOW (L), whereas c0s1 remains LOW (L)=. At this transition, out_clk1 has a rising edge while out_clk0 is L. Later, at around 278 ns, out_clk0 has a rising edge of while out_clk1 is H, so that c0s1 transitions to H, while c1s0 remains L. In the middle, i.e. between the transition zone of about 122 ns and about 278 ns, both c0s1 and c1s0 are L. The width of this transition zone is most likely due to the setup times of the sampling flops. The general algorithm for the synchronization is to find this null where c0s1 and c1s0 are both L, to find its boundaries, and to then move close to the center, which in the present example is located at about 200 ns. This center at about 200 ns represents a point of alignment where the clock output signals out_clk0 and out_clk1 are aligned, i.e. where the phase difference between clk0 and out_clk1 is substantially equal to zero, as illustrated in the lower graph of FIG. 5.

Figure 6:
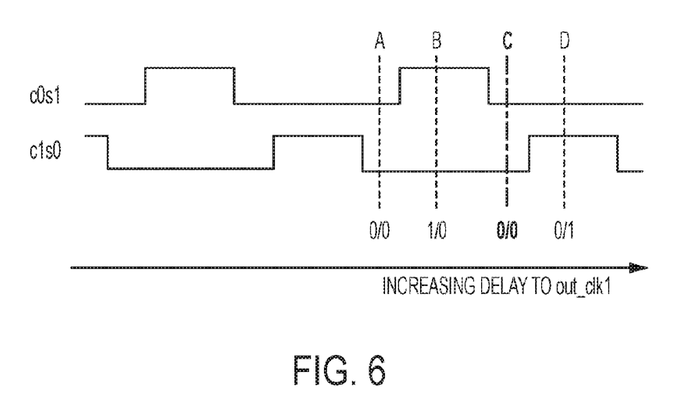
FIG. 6 shows mutual sampling of two sampling clocks akin to FIG. 5 over a wider delay range, and indicating various possible initial alignments, according to some embodiments of the disclosure.

According to some embodiments of the disclosure, the algorithm can be sped up by noting the initial starting value on the abscissa of FIG. 5 when a synch is requested, although the phases of output signals out_clk0 and out_clk1 can always be determined and aligned by stepping from an arbitrary starting point until both null edges are found. FIG. 6 shows the relationship between the outputs 'c0s1' and 'c1s0' of the flip-flops of FIG. 4, wherein 'c0s1' indicates the output of a flip-flop of FIG. 4 when clocked by out_clk0 and the respective 'D' input is out_clk1, and 'c1s0' is the output of a flip-flop of FIG. 4 when clocked by out_clk1 and the respective 'D' input is out_clk0. The x-axis indicates the time delay between out_clk0 and out_clk1 as the phase codes are swept to the PI 206.

Assuming in a first scenario that the starting point is point B in FIG. 6 with c0s1/c1s0=1/0. The rising edge of out_clk0 is then known to occur after the rising edge of out_clk1. In this case, a delay is added to out_clk1 by decreasing the value of the phase of clock $\phi1[n]$ of sampler block 302 to align out_clk1 with out_clk0. This is equivalent to moving the 'observation point' B in FIG. 6 to the right to point C, resulting in alignment of the two clocks at 0/0. This is the same as the midpoint at about 200 ns in FIG. 4.

Assuming now in a second scenario that the starting point is point D in FIG. 6 with c0s1/c1s0=0/1. In this case, the phase of clock $\phi1[n]$ of sampler block 302 is decreased until c1s0 goes L (wrapping if necessary), and then further decreased until c0s1 goes H. The two clocks are then in alignment at point A, also resulting of at 0/0.

Accordingly, there are two points corresponding to a phase alignment a 'more advantageous' point C and a 'less advantageous' point A. The meaning of 'more advantageous' and 'less advantageous' will become clearer from the discussion below. However, the approach is in both cases the same; the phase of clock $\phi1[n]$ of sampler block 302 is decreased until c1s0 goes H, whereafter the phase of clock $\phi1[n]$ of sampler block 302 is increased until c0s1 goes H. These are the null boundaries around point C. This approach works regardless of whether the 0/0 starting point is point C or point A, if first the point is determined where c1s0 is going H and thereafter the point where c0s1 is going H. The result will then always be point C.

Figure 7A:
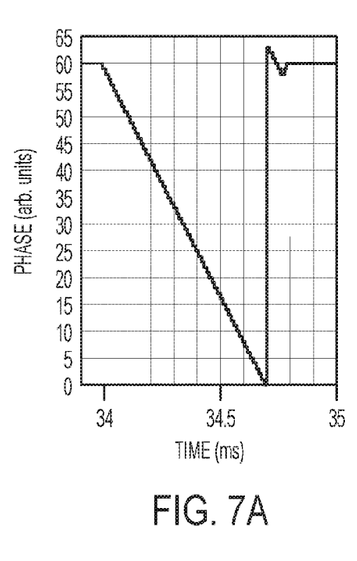
FIGS. 7a and 7b show timing diagrams of the synchronization algorithm for finding phase alignment from different starting points, according to some embodiments of the disclosure.
Figure 7B:
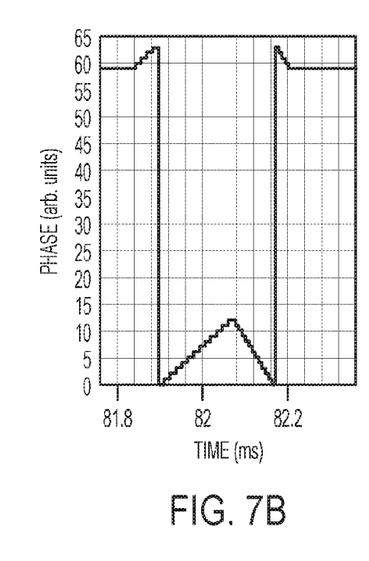

The aforedescribed scenarios using different starting points are illustrated in FIGS. 7a and 7b. FIG. 7a shows an example of the first scenario wherein the value of the phase of clock $\phi1[n]$ of sampler block 302 is decreased (moving to the right in FIG. 6) in 64 steps, starting at point B in FIG. 6, corresponding to c0s1/c1s0=1/0. The phase relationship repeats, in this example modulo 64. An example of the second scenario is illustrated in FIG. 7b, wherein the starting point is point D in FIG. 6, corresponding to c0s1/c1s0=0/1. In this case, the phase of clock $\phi1[n]$ of sampler block 302 is incremented until c1s0 goes L, and thereafter further incremented until c0s1 goes H, at which point the null boundaries are known, and the phases can be aligned as described above.

With proper relative alignment of the output signals out_clk0 and out_clk1, the interleaved words M0 and M1 generated by sampler blocks 301, 302 can be aligned provided that there is no path delay or other discrepancy in getting the data to the samplers 207, 208 in sampler blocks 301, 302, respectively, that would need to be accounted for. To this end, the sampler inputs would need to be exactly the same, for example, physically wired/shorted together. However, in most situations there will be path delays and gate delays which are shown in FIG. 3 as $\tau_{D0}$ and $\tau_{D1}$. Delays or discrepancies between the received data can occur when $\tau_{D0}$ and $\tau_{D1}$ differ from one another.

Alignment of the Words M0 and M1

If there is a mismatch in the paths from the measurement point (DATA) to the respective samplers 207, 208, then the sampling instants will be misaligned by the amount of the path difference $|\tau_{D0}-\tau_{D1}|$ even when the clocks out_clk0 and out_clk1 were previously aligned by using the aforedescribed clock alignment process.

A non-zero $\tau_{skew}$, can hence not be accounted by examining the output signals out_clk0 and out_clk1 alone. However, referring back to FIG. 3, $\tau_{skew}$, can be corrected for by a one-time calibration by aligning the output words M0 and M1, which in the present example will be assumed to be 40b words.

The second calibration procedure where the output words M0 and M1 are aligned starts after the output signals out_clk0 and out_clk1 have been aligned as previously described. The samples, i.e. the 40b output words coming from each sampler block of the samplers DLLs or CDRs 203, 204 are then examined and compared with one another for a given phase of clock $\phi1[n]$ of sampler block 302 while holding the phase of clock $\phi0[n]$ of sampler block 301 constant. The phase of clock $\phi1[n]$ of sampler block 302 is then moved and more samples are compared. By taking an equal and statistically significant number of comparisons per phase of clock $\phi1[n]$ of sampler block 302, the phase of clock $\phi1[n]$ that yields the highest number of matched samples will equal the phase of clock $\phi1[n]$ of sampler block 302 where the sampling clocks are best aligned and $\tau_{skew}$, is accounted for.

Figure 8:
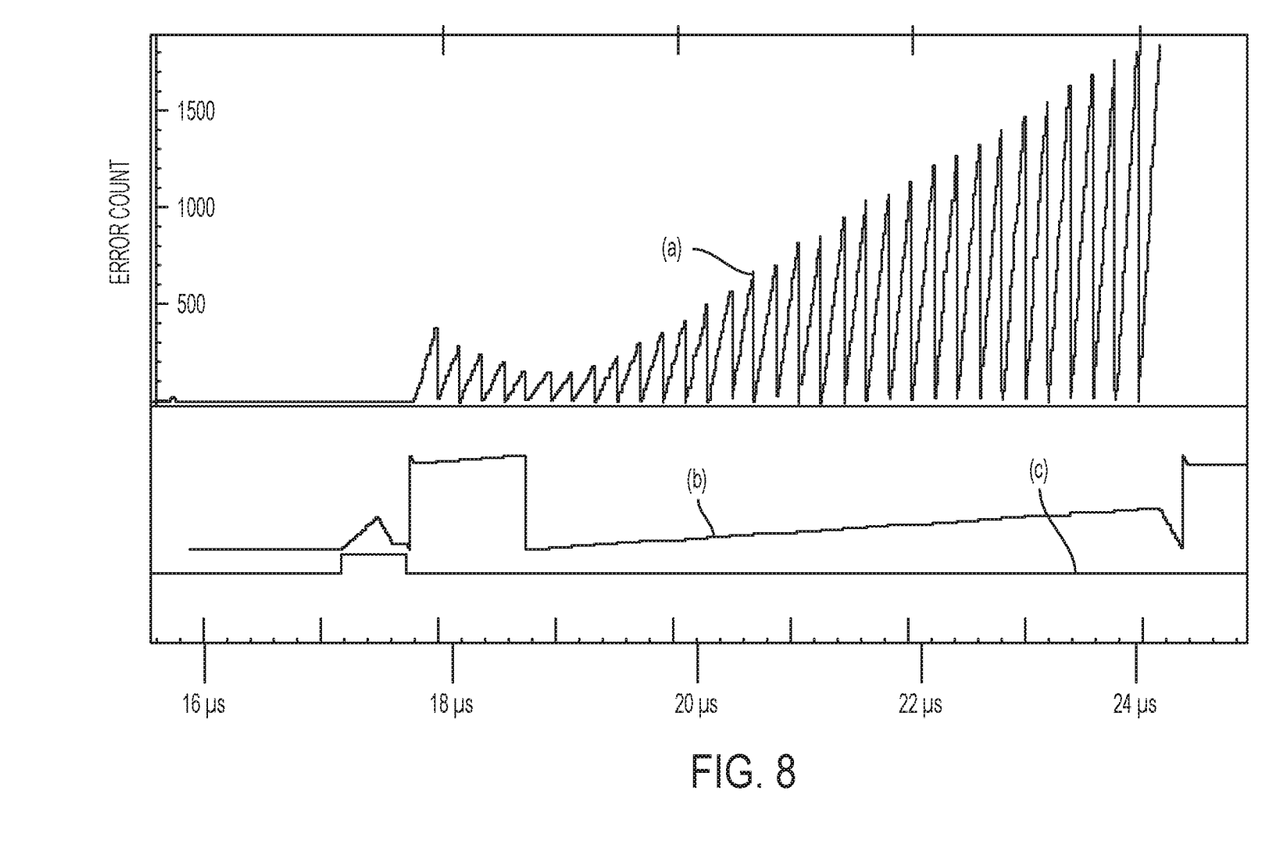
FIG. 8 shows a sweep of the phase of one of the sampling clocks to find a phase offset that minimizes XOR-d sampling error relative to the other sampling clock.

FIG. 8 shows an example of a data sweep following alignment of the output signals out_clk0 and out_clk1. Graph (b) shows the quick up-down movement of the phase code of clock $\phi1[n]$ of sampler block 302 that occurs from about 17.2 μs to about 17.7 μs (when a 'request synchronization' signal in graph (c) is high). In this simulation, the codes are intentionally offset by −16 codes from where the two output signals out_clk0 and out_clk1 should be aligned. From this point forward, XOR data from the data word M0 from CDR0 and the data word M1 from CDR1 are collected and the number of counted bit-errors is tallied as an error count (saw-tooth pattern, graph (a)). If the value of the error count is less than the previous value, the searched-for minimum is likely to the right, and the previously introduced offset correction code is updated. The code yielding the minimum error count is recorded, indicating the closest possible alignment of the output signals out_clk0 and out_clk1 that takes into account $\tau_{skew}$.

The circuits illustrated the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SoC) package, either in part, or in whole. A SoC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It should be noted that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to medical systems, scientific instrumentation, wireless and wired communications, radar, industrial process control, audio and video equipment, current sensing, instrumentation (which can be highly precise), and other analog- and digital-processing-based systems where high-speed data processing is desired.

In yet other example scenarios, the teachings of the present disclosure can be applicable in the industrial markets that include high-speed data processing process control systems that help drive productivity, energy efficiency, and reliability.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc.

What is claimed is:

1. A method for aligning sampling instances of high-data-rate clock-and-data recovery deserializer (CDR) having multiple sampler blocks, the method comprising:
   delaying a second sampling clock phase of a second sampler block in relation to a first sampling clock phase of a first sampler block;
   measuring relative positions of the first and second clock output signals produced by the first and second sampler blocks by varying a delay between the first and second sampling clock phase;
   determining from the relative positions, as a function of the delay, a point of alignment where the first and second clock output signals are aligned; and
   based on the determined point of alignment, offsetting the first and second clock output signals from one another such that the sampling instances of the first and second sampler blocks are temporally interleaved.

2. The method of claim 1, further comprising
decimating a reference clock rate in the first sampler block and in the second sampler block by a common decimation ratio; and
generating corresponding first and second decimated clock output signals;
wherein the point of alignment is determined based on the first and second decimated clock output signals.

3. The method of claim 2, wherein:
the first decimated output clock signal is sampled with the second decimated output clock signal, and the second decimated output clock signal is sampled with the first decimated output clock signal; and
the point of alignment is inferred from phase codes that cause the first decimated output clock signal to change state in relation to the second decimated output clock signal, and vice versa.

4. The method of claim 3, wherein the point of alignment corresponds to a midpoint between locations where the first decimated output clock signal sampled with the second decimated output clock signal goes from high to low, and where the second decimated output clock signal sampled with the first decimated output clock signal goes from low to high.

5. The method of claim 1, further comprising sampling, with the multiple sampler blocks, serially received input data at the temporally interleaved sampling instances, and generating therefrom, in the multiple sampler blocks, parallel data words.

6. The method of claim 5, further comprising, based on the determined point of alignment, comparing the generated parallel data words with one another, to correct for additional timing offsets between the multiple sampler blocks.

7. The method of claim 6, wherein the additional timing offsets are corrected by determining a minimum error count of misaligned XOR bits between the compared parallel data words.

8. The method of claim 6, wherein the additional timing offsets are time-invariant, and the point of alignment of the first and second clock output signals is corrected by applying the additional timing offsets.

9. The method of claim 8, wherein the point of alignment is corrected after power-on or reset of the CDR.

10. A system for aligning sampling instances of a high-data-rate clock-and-data recovery deserializer (CDR), comprising:
first and second sampler blocks operating in parallel and receiving common serial input data, with each sampler block comprising a phase interpolator receiving a reference clock signal and generating a respective sampling clock phase, and a delay-locked loop (DLL) block producing a synchronous clock output signal and a parallel data word corresponding to the received common serial input data;
wherein the phase interpolator of the second sampler block varies a delay of a second sampling clock phase in relation to a first sampling clock phase to determine, as a function of the delay, a point of alignment where the respective synchronous clock output signals are aligned relative to one another.

11. The system of claim 10, wherein the phase interpolator of the second sampler block offsets the aligned first and second clock output signals from one another by a fixed number of phase steps added in the phase interpolator of the second sampler block, to temporally interleave the sampling instances of the first and second sampler blocks.

12. The system of claim 10, wherein:
each sampler block comprises a divider that decimates the reference clock signal to generate, in the DLL block, a respective clock output signal at a decimated frequency; and
the point of alignment is determined based on first and second decimated clock output signals.

13. The system of claim 12, wherein:
the first decimated output clock signal is sampled with the second decimated output clock signal, and the second decimated output clock signal is sampled with the first decimated output clock signal; and
the point of alignment is inferred from phase codes that cause the first decimated output clock signal to change state in relation to the second decimated output clock signal, and vice versa.

14. The system of claim 13, wherein the point of alignment corresponds to a midpoint between locations where the first decimated output clock signal sampled with the second decimated output clock signal goes from high to low, and where the second decimated output clock signal sampled with the first decimated output clock signal goes from low to high.

15. The system of claim 14, wherein the system is configured to generate, after determining the point of alignment, with the DLL block, parallel data words from the common serial input data received by the first and second sampler blocks and compare the generated parallel data words with one another to correct additional timing offsets between the first and second sampler blocks.

16. The system of claim 15, wherein the additional timing offsets are corrected by determining a minimum error count of misaligned XOR bits between the compared parallel data words.

17. The system of claim 15, wherein the additional timing offsets are time-invariant, and the point of alignment of first and second clock output signals of the first and second sampler blocks is corrected by applying the additional timing offsets.

18. A method comprising:
sampling serial input data by first and second samplers;
delaying a second sampling clock phase of the second sampler in relation to a first sampling clock phase of the first sampler;
sampling a first clock output signal of the first sampler and a second clock output signal of the second sampler against each other, as a phase relationship between the first sampling clock phase and the second sampling clock phase is varied;
determining a point of alignment where the first and second clock output signals are aligned based on results from sampling the first and second clock output signals against each other; and
offsetting the first and second clock output signals from one another based on the determined point of alignment, such that sampling instances of the first and second samplers are temporally interleaved.

19. The method of claim 18, further comprising:
decimating a clock rate in the first and second samplers by a common decimation ratio and generating corresponding first and second decimated clock output signals; and
aligning the first and second decimated clock output signals with one another at a midpoint between locations where the first decimated output clock signal sampled with the second decimated output clock signal goes from high to low, and where the second decimated output clock signal sampled with the first decimated output clock signal goes from low to high.

20. The method of claim 18, further comprising:
generating parallel data words from the serial input data received by the first and second samplers;
tallying error counts between the generated parallel data words for different second sampling clock phases, as the second sampling clock phase is moved while the first sampling clock phase is held constant; and
determining a timing skew between the first and second samplers based on a minimum of the error counts.

* * * * *